United States Patent
Zhou et al.

(10) Patent No.: US 7,238,619 B2
(45) Date of Patent: Jul. 3, 2007

(54) METHOD FOR ELIMINATING BRIDGING DEFECT IN VIA FIRST DUAL DAMASCENE PROCESS

(75) Inventors: Wen-Zhan Zhou, Singapore (SG); Hong Ma, Singapore (SG); Kuang-Yeh Chang, Taipei (TW)

(73) Assignee: United Microelectronics Corp., Hsin-Chu (TW)

( * ) Notice: Subject to any disclaimer, the term of this patent is extended or adjusted under 35 U.S.C. 154(b) by 201 days.

(21) Appl. No.: 11/160,688

(22) Filed: Jul. 6, 2005

(65) Prior Publication Data

US 2007/0010092 A1    Jan. 11, 2007

(51) Int. Cl.
    *H01L 21/311* (2006.01)

(52) U.S. Cl. .................. 438/696; 438/595; 438/637; 438/639; 438/672; 438/700

(58) Field of Classification Search ................ 438/698, 438/696, 700, 666, 970, 675, 676, 637–640, 438/672, 687, 976
See application file for complete search history.

(56) References Cited

U.S. PATENT DOCUMENTS

| | | |
|---|---|---|
| 6,689,695 B1 | 2/2004 | Lui et al. |
| 6,780,761 B1 * | 8/2004 | Wu et al. .................. 438/637 |
| 2003/0199169 A1 | 10/2003 | Jun et al. |
| 2004/0072430 A1 | 4/2004 | Huang et al. |

* cited by examiner

*Primary Examiner*—N. Drew Richards
*Assistant Examiner*—Jenny L. Wagner
(74) *Attorney, Agent, or Firm*—Winston Hsu

(57) ABSTRACT

A via-first dual damascene process is disclosed. When forming trench lines directly above two small pitched, dense via openings having diameter that is substantially equal to the line width of the trench lines, the trench photoresist is biased on the via openings to partially mask the sidewalls of the two dense via openings. By doing this, via-to-via bridging defects can be avoided.

14 Claims, 15 Drawing Sheets

METHOD FOR ELIMINATING BRIDGING DEFECT IN VIA FIRST DUAL DAMASCENE PROCESS

BACKGROUND OF THE INVENTION

1. Field of the Invention

The present invention relates generally to copper interconnects. More particularly, the present invention relates to a via-first dual damascene process capable of avoiding bridging defects.

2. Description of the Prior Art

Damascene processes incorporated with copper interconnect technique are known in the art, which are also referred to as "copper damascene processes" in the semiconductor industry. The continuous miniaturization of copper chip wiring and consequently shrinkage of line width and via size/space poses significant challenges.

In a via-first approach, the vias are defined first in the inter-layer dielectric, followed by patterning the trenches. The sequence of forming the damascene recesses in the via-first approach begins by exposing the via patterns with the first mask. After etching the vias completely through the entire dielectric stack (except not through the barrier layer at the bottom of the dielectric stack) and stripping the resist, a second mask is used to pattern the trenches. The trenches are then created by etching the dielectric down to the embedded etch-stop layer.

Typically, the barrier layer at the bottom of the vias is protected from further etching during the trench-etch by a resist layer that floods the vias. After the resist is stripped and the etch-stop layer at the bottom of the via is removed by dry-etching, the metal that fills both the vias and the trenches can be deposited. After deposition, it is polished back to create the dual-damascene structure.

FIGS. 1–5 are schematic, cross-sectional diagrams showing several typical intermediate phases of a semiconductor wafer during the via-first dual damascene process according to the prior art method. As shown in FIG. 1, conductive structures 111 and 112 such as damascened copper wirings are provided in a device layer 101 of a semiconductor substrate 100. A capping layer 115 such as silicon nitride is deposited to cover the exposed conductive structures 111 and 112, and the device layer 101. A dielectric stack 120 is then deposited on the capping layer 115. The dielectric stack 120 is composed of a first dielectric layer 121, a second dielectric layer 123, and an etch stop layer 122 interposed between the first dielectric layer 121 and the second dielectric layer 123. A silicon oxy-nitride layer 130 is then deposited on the first dielectric layer 121.

A first photoresist layer 140 having via openings 141 and 142 is formed on the silicon oxy-nitride layer 130, assuming that the via opening 141 is an isolated via pattern, i.e. there is no other via opening located in the proximity of the via opening 141, and the via opening 142 is a dense via pattern. Using the first photoresist layer 140 as a etching mask, an etching process is performed to etch away, in the order of, the silicon oxy-nitride layer 130, the dielectric stack 120, to the capping layer 115, through the via openings 141 and 142, thereby forming via holes 151 and 152a/b.

As shown in FIG. 2, after stripping the first photoresist layer 140 off the silicon oxy-nitride layer 130, a gap-filling polymer (GFP) layer 200 is coated on the semiconductor substrate 100 and fills the via holes 151 and 152a/b. The GFP layer 200 is typically composed of resist materials known in the art. Coating of the GFP layer 200 is known in the art and an additional post-baking step may be carried out if desired.

As shown in FIG. 3, the GFP layer 200 is then etched back to a predetermined depth so as to form plug 201 in the isolated via hole 151 and plugs 202a/202b in the dense via holes 152. The top surface of the plugs 201 and 202a/b is lower than the top surface of the silicon oxy-nitride layer 130, forming recesses 301, 302a and 302b. As shown in FIG. 4, a second photoresist layer 400 is coated on the semiconductor substrate 100 and fills the recesses 301 and recesses 302a/b using methods known in the art such as spin coating.

As shown in FIG. 5, following the coating of the second photoresist layer 400, a lithographic process is carried out. The exposed second photoresist layer 400 is developed using a proper developer. Trench 411 is formed above the recess 301, trench 412a is formed directly above the recess 302a, and trench 412b is formed directly above the recess 302b.

Please refer to FIG. 6 and briefly back to FIG. 5, wherein FIG. 6 is a plan view of the via holes and trench patterns of the second photoresist layer 400 of FIG. 5, and FIG. 5 is a cross-sectional view taken along line I—I of FIG. 6. As shown in FIGS. 5 and 6, the line width L of the trench 412a is equal to the diameter of the underlying via hole 152a. Likewise, the line width of the trench 412b is equal to the diameter of the underlying via hole 152b. The line width of the trench pattern 411 is larger than the diameter of the underlying via hole 151.

One drawback of the above-described prior art method is that when etching trench lines into the dielectric stack 120 in the following trench forming step, the exposed first dielectric layer 121 of the dielectric stack 120 in the recesses 301, 302a and 302b are also laterally etched. Since the via 152a and via 152b are very close to each other, such lateral etch of the exposed first dielectric layer 121 between the dense via 152a and 152b usually causes bridging defect after copper CMP.

SUMMARY OF THE INVENTION

It is the primary object of the present invention is to provide an improved via-first dual damascene process to alleviate or eliminate the via-to-via bridging problem.

To achieve the above object, a via-first dual damascene process is provided. The via-first dual damascene process includes the following steps:

providing a semiconductor substrate having a dielectric layer deposited over the semiconductor substrate, wherein the dielectric layer has a via opening;

filling the via openings with a gap-filling polymer to form a gap-filling polymer (GFP) layer on the dielectric layer;

etching the GFP layer back to a predetermined depth to form a GFP plug in the via opening, wherein an exposed surface of the GFP plug is lower than a top surface of the dielectric layer, thereby forming a recess above the via opening;

coating a photoresist layer over the dielectric layer, the photoresist layer filling the recess;

performing a lithographic process to form a trench line pattern in the photoresist layer above the via opening, wherein the trench line pattern has a first section that has a substantially constant line width L and does not overlap with the via opening, and a second section that is directly above the via opening and has a tapered line width smaller than L, wherein the line width L is substantially equal to diameter of the via opening; and etching the dielectric layer and the GFP layer through the trench line pattern using the photoresist layer as an etching mask.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1:
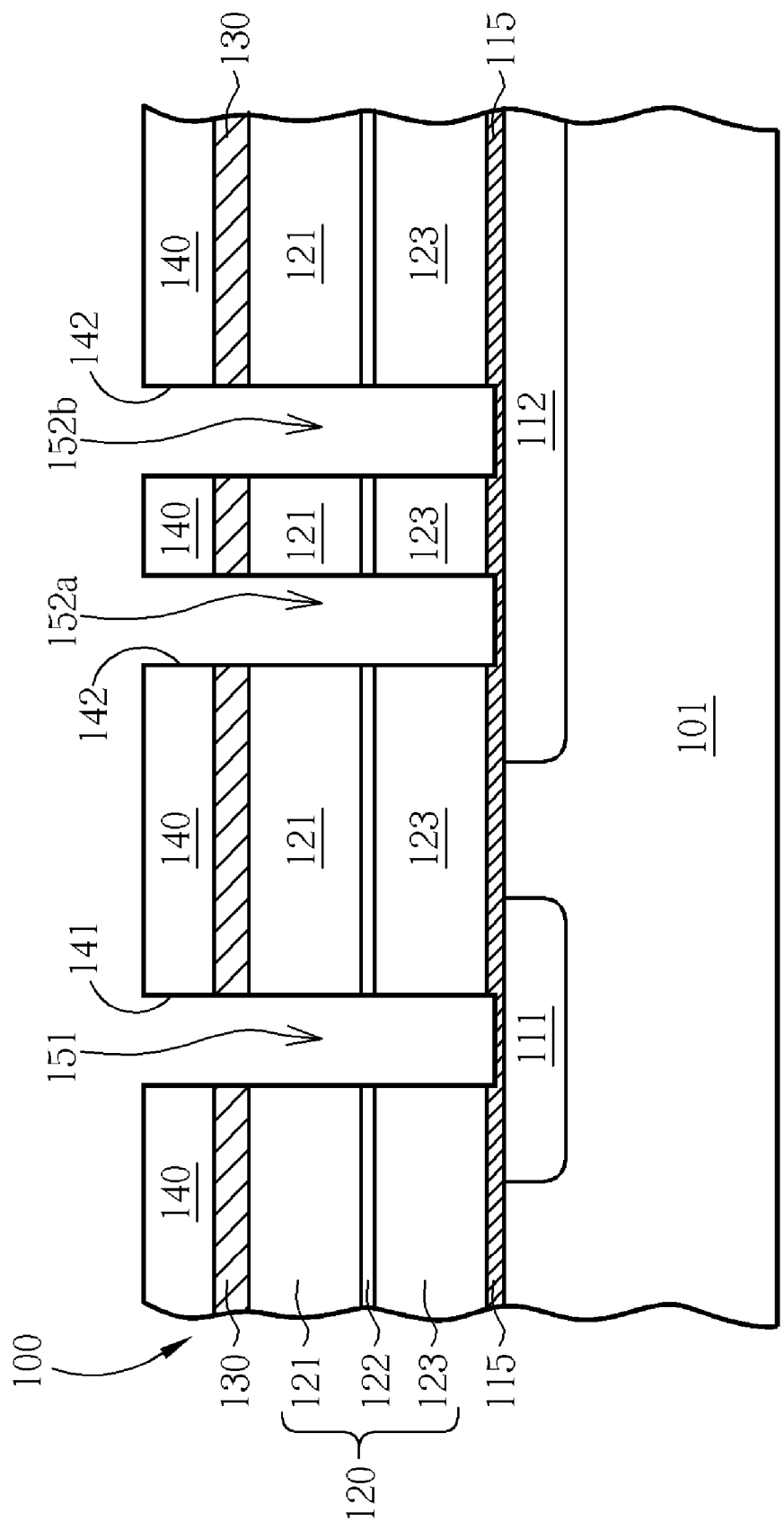
FIG. 1 to FIG. 5 are cross-sectional schematic diagrams showing several typical intermediate phases of a semiconductor wafer during the via-first dual damascene process according to the prior art method.
Figure 2:
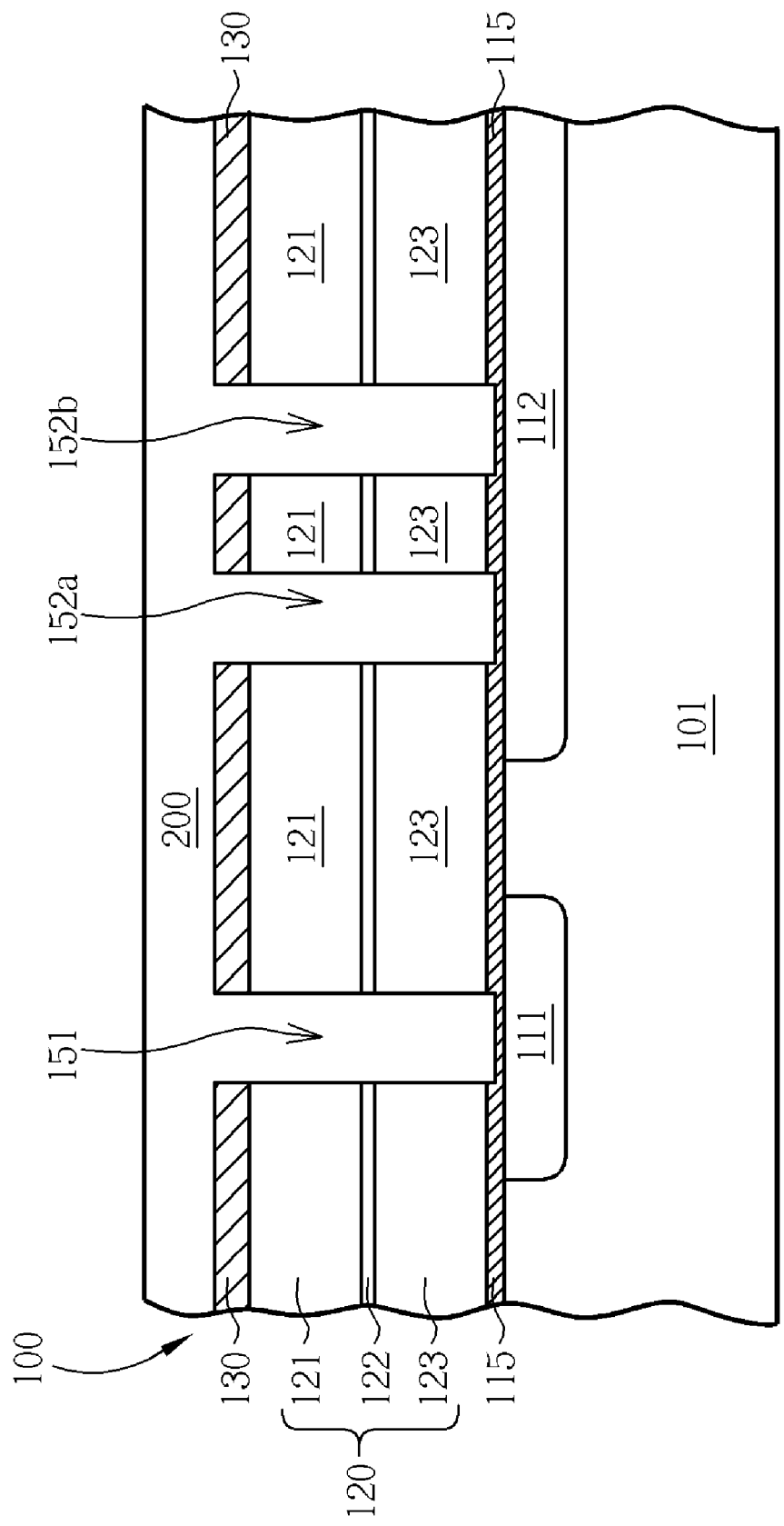
Figure 3:
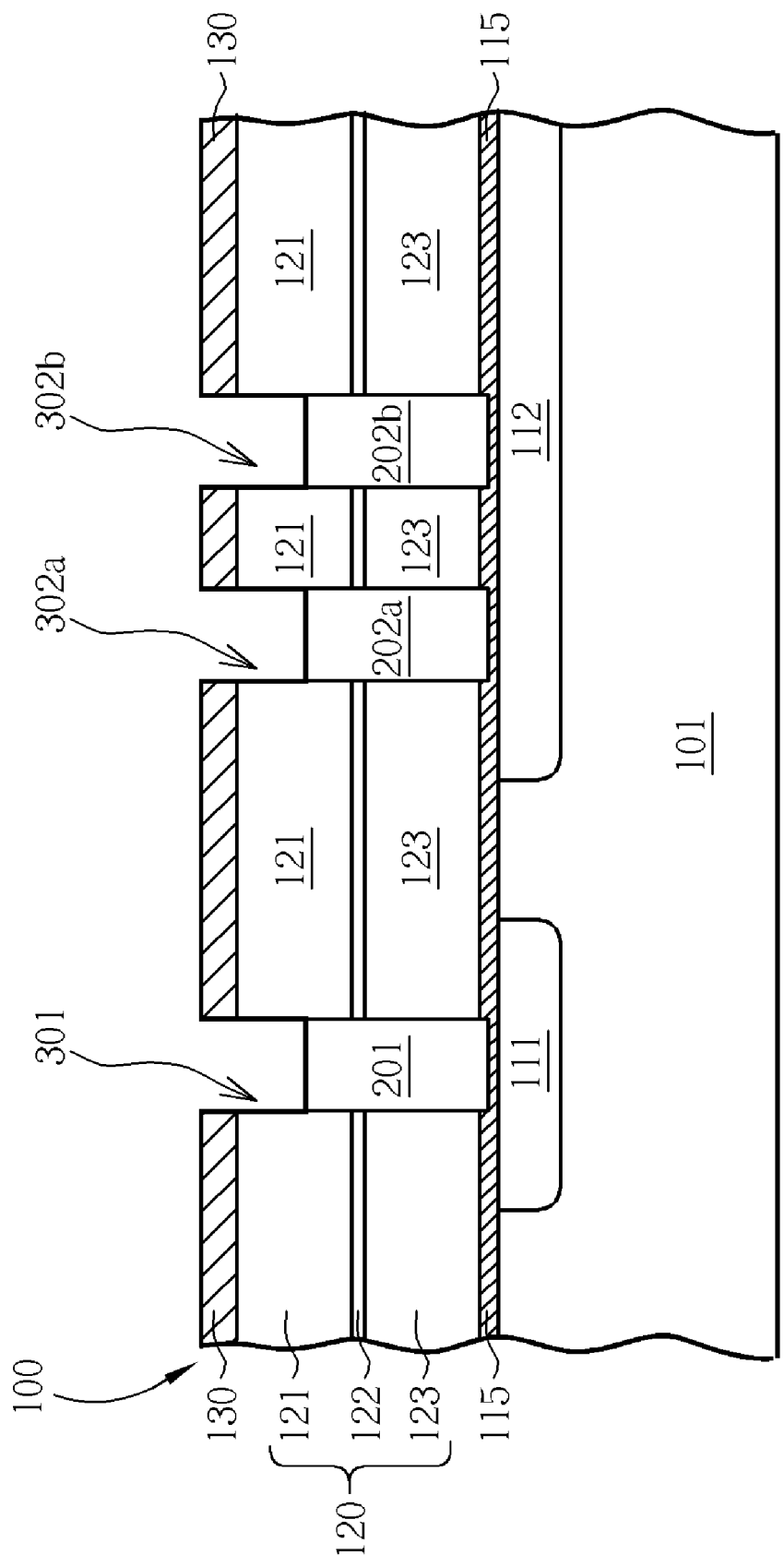
Figure 4:
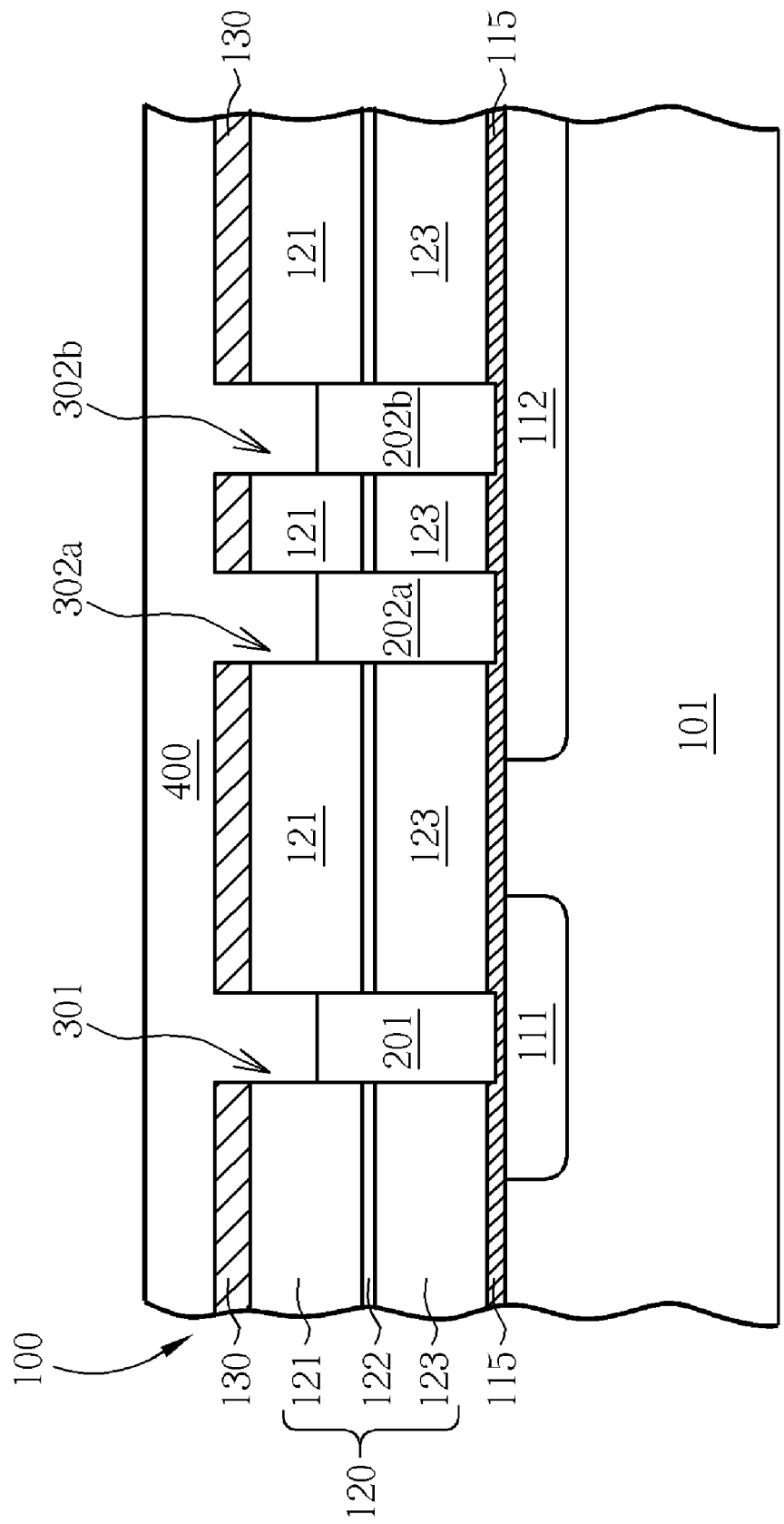
Figure 5:
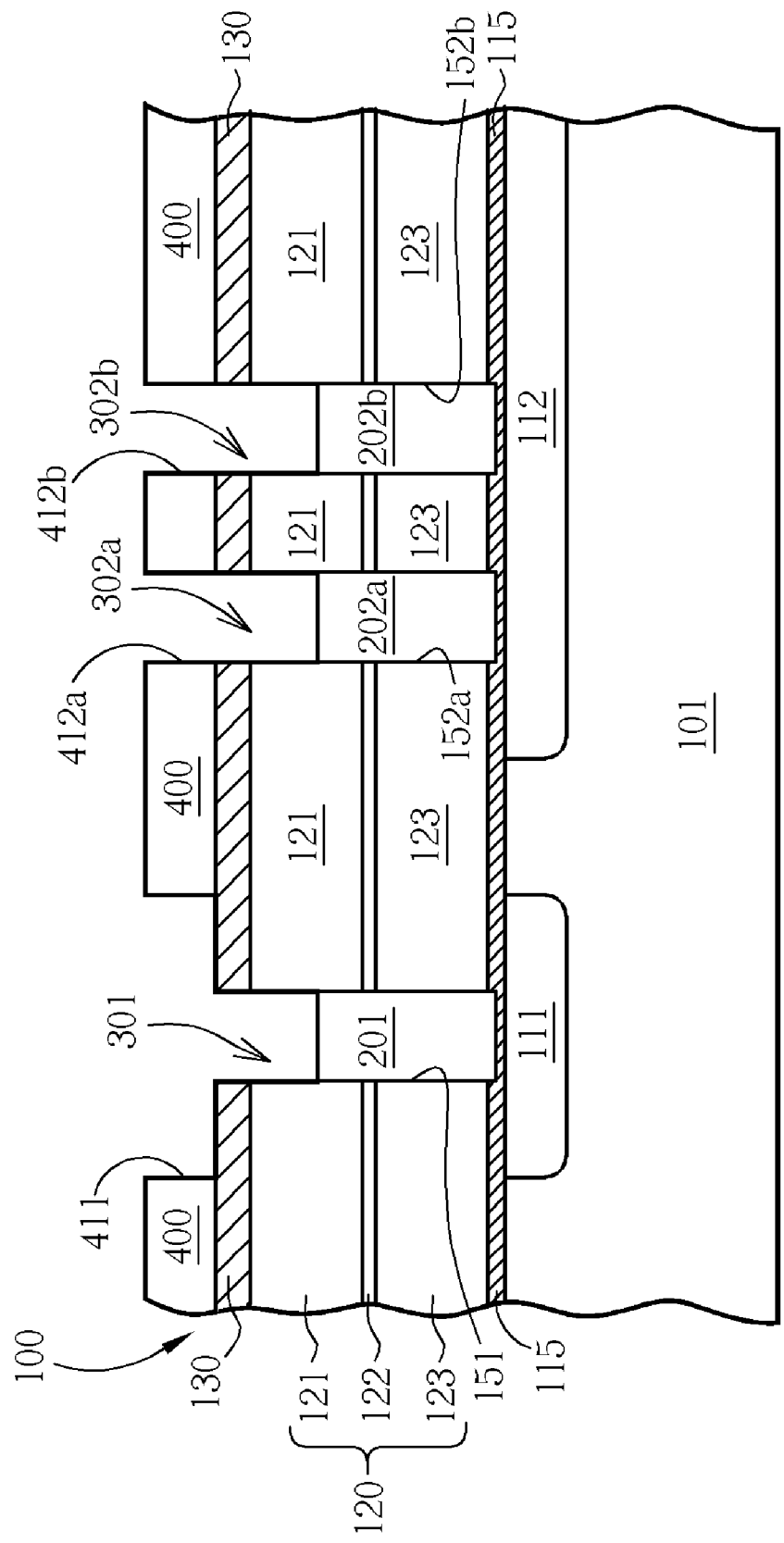
Figure 6:
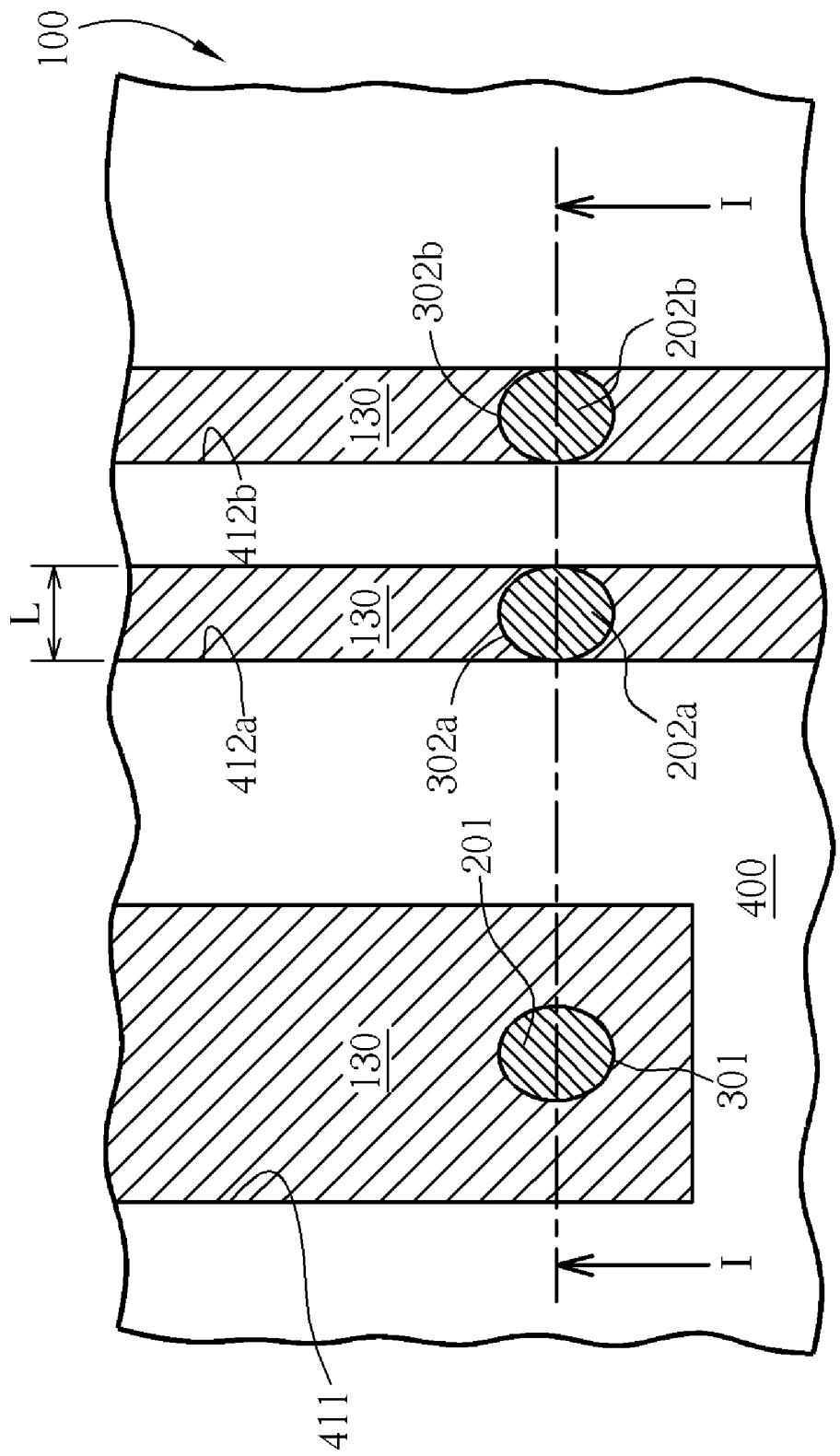
FIG. 6 is a top view of FIG. 5.
Figure 7:
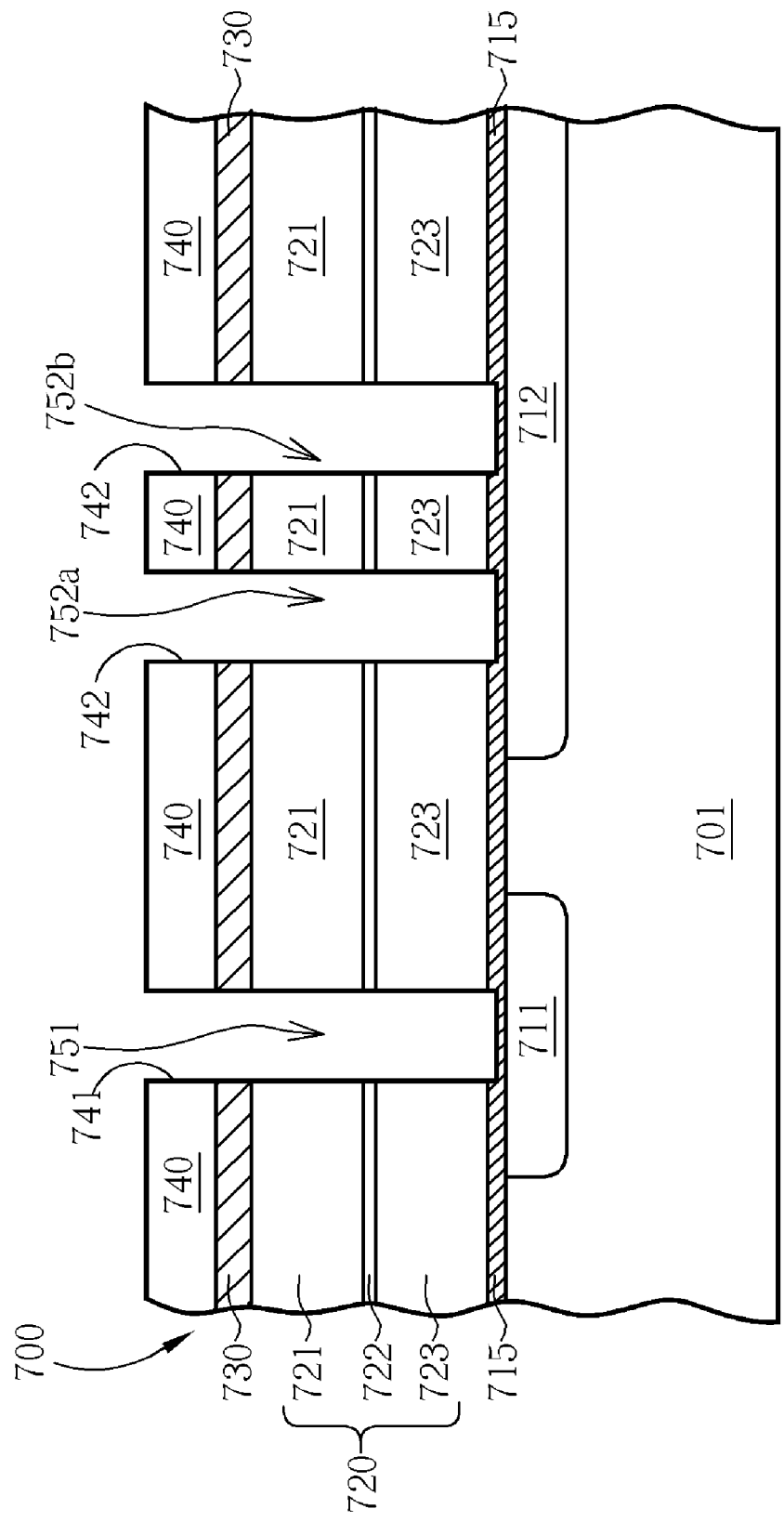
FIG. 7 to FIG. 12 are cross-sectional schematic diagrams illustrating the via-first dual damascene process according to one preferred embodiment of this invention.

Please refer to FIG. 7 to FIG. 12. FIG. 7 to FIG. 12 are schematic, cross-sectional diagrams illustrating the via-first dual damascene process according to the preferred embodiment of this invention. As shown in FIG. 7, a semiconductor substrate 700 is provided. Conductive structures 711 and 712 such as damascened copper wirings are provided in a device layer 701 of the semiconductor substrate 700. The device layer 701 may be a low-k dielectric, but not limited thereto. Subsequently, a capping layer 715 such as silicon nitride is deposited to cover the exposed conductive structures 711 and 712, and the device layer 701 over the semiconductor substrate 700.

Likewise, a dielectric stack 720 is formed on the capping layer 715. The dielectric stack 720 is composed of a first dielectric layer 721, a second dielectric layer 723, and an etch stop layer 722 interposed between the first dielectric layer 721 and the second dielectric layer 723. Preferably, both of the first dielectric layer 721 and the second dielectric layer 723 have a dielectric constant of less than 3.0. For example, suitable low-k material for the first dielectric layer 721 and the second dielectric layer 723 may be selected from the group including, but not limited to, FLARE™, SiLK™, poly(arylene ether) polymer, parylene, polyimide, fluorinated polyimide, HSQ, BCB, FSG, silicon dioxide, and nanoporous silica.

Still referring to FIG. 7, a silicon oxy-nitride layer 730 is then deposited on the first dielectric layer 721. A first photoresist layer (Via Photo) 740 having via openings 741 and 742 is formed on the silicon oxy-nitride layer 730, assuming that the via opening 741 is an isolated via pattern, i.e. there is no other via opening located in the proximity of the via opening 741, and the via openings 742 are dense via pattern. Using the first photoresist layer 740 as an etching mask, an etching process is performed to etch away, in the order of, the silicon oxy-nitride layer 730, the stacked layer 720, to the capping layer 715, through the via openings 741 and 742, thereby forming deep via holes 751, 752a and 752b. The average diameter of via holes 751, 752a and 752b is about 0.08–0.2 micrometers.

Figure 8:
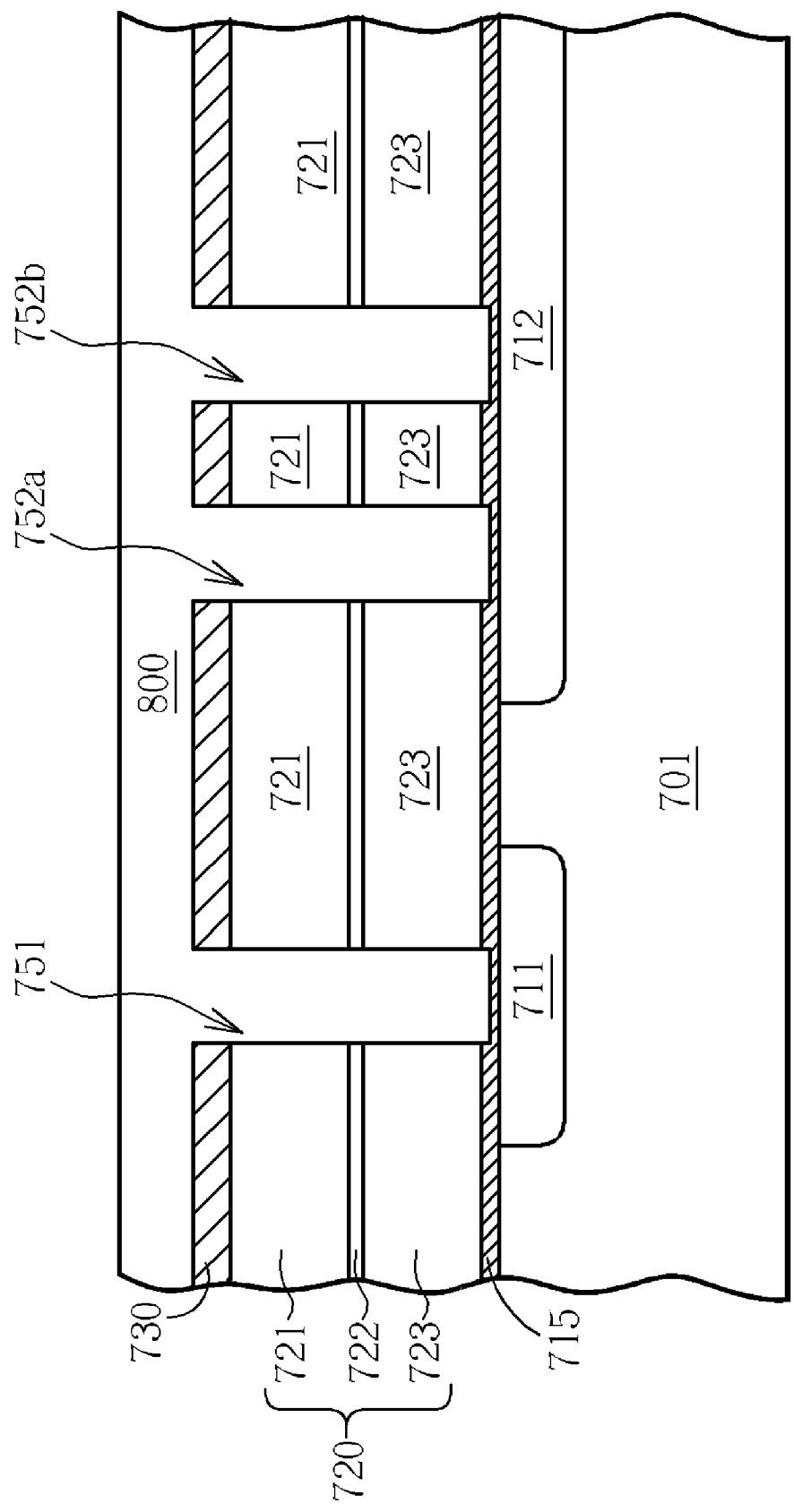

As shown in FIG. 8, the first photoresist layer 740 is stripped off from the silicon oxy-nitride layer 730 by methods known in the art such as oxygen plasma ashing. A gap-filling polymer (GFP) layer 800 is then coated on the semiconductor substrate 700 and fills the via holes 751, 752a and 752b. The GFP layer 800 may be composed of an i-line resist such as novolak, poly hydroxystyrene (PHS) or acrylate-based resins. Spin coating of the GFP layer 800 is known in the art and optional post-baking step may be carried out if desired.

Figure 9:
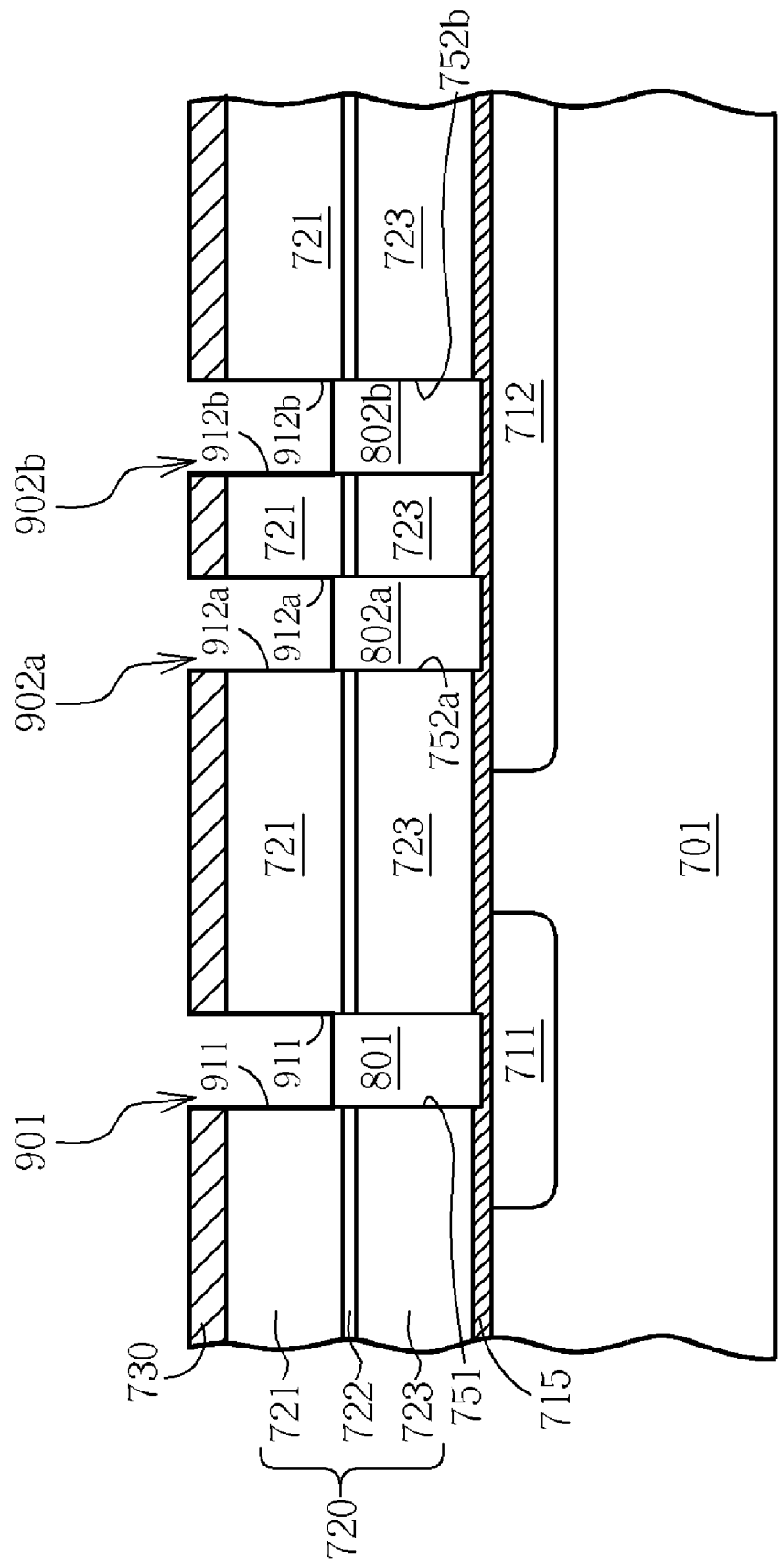
Figure 10:
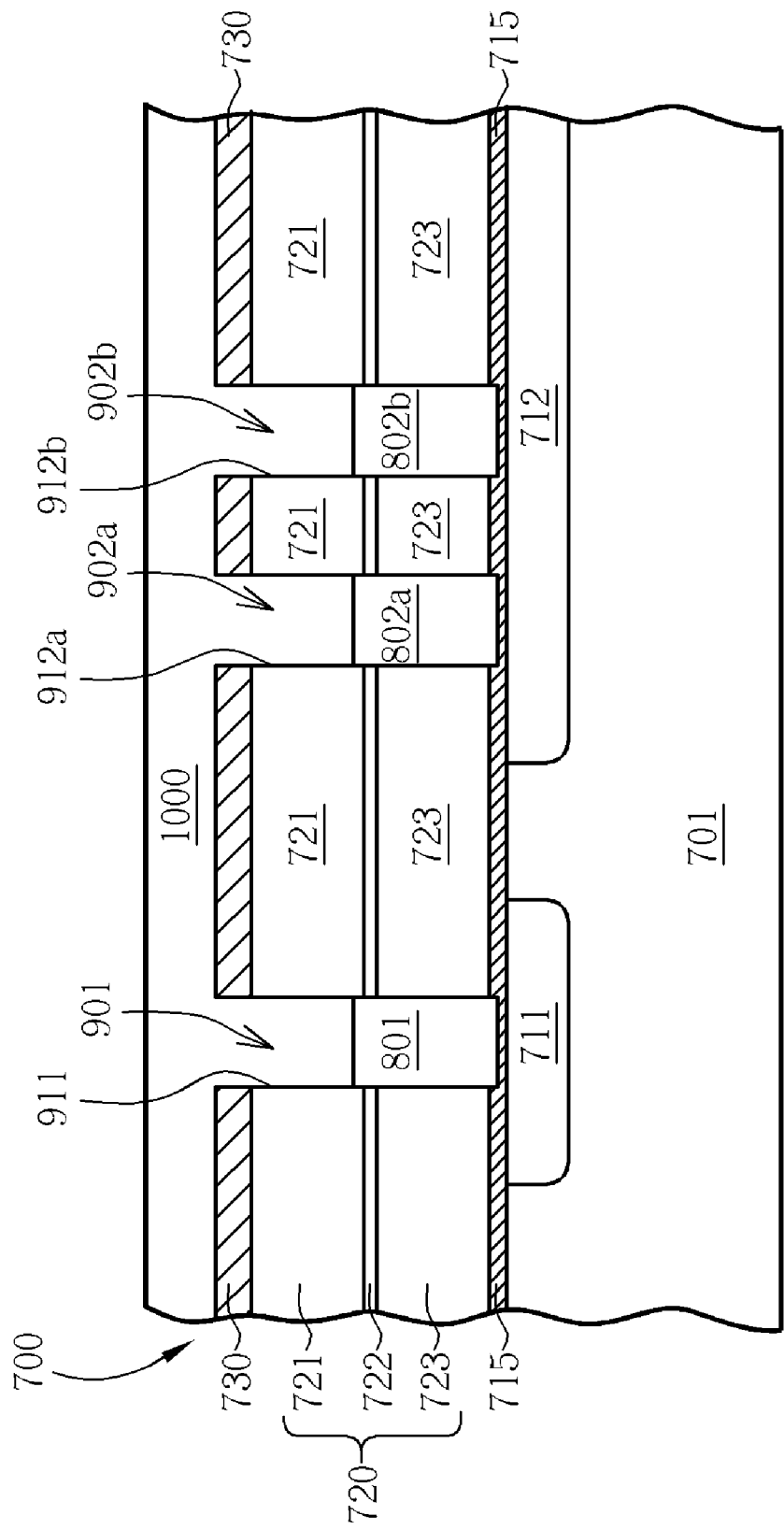

As shown in FIG. 9, the GFP layer 800 is then etched back to a predetermined depth so as to form GFP plugs 801, 802a and 802b within the via holes 901, 902a and 902b, respectively. The top surface of the GFP plugs 801, 802a and 802b is lower than the surface of the silicon oxy-nitride layer 730, thereby forming recesses 901, 902a and 902b. The recesses 901, 902a and 902b are defined by the respective sidewalls 911, 912a and 912b and the corresponding exposed top surfaces of the GFP plugs 801, 802a and 802b. As shown in FIG. 10, a second photoresist layer (Trench Photo) 1000 is coated on the semiconductor substrate 700 and fills the treated recesses 901, 902a and 902b using methods known in the art such as spin coating.

Figure 11:
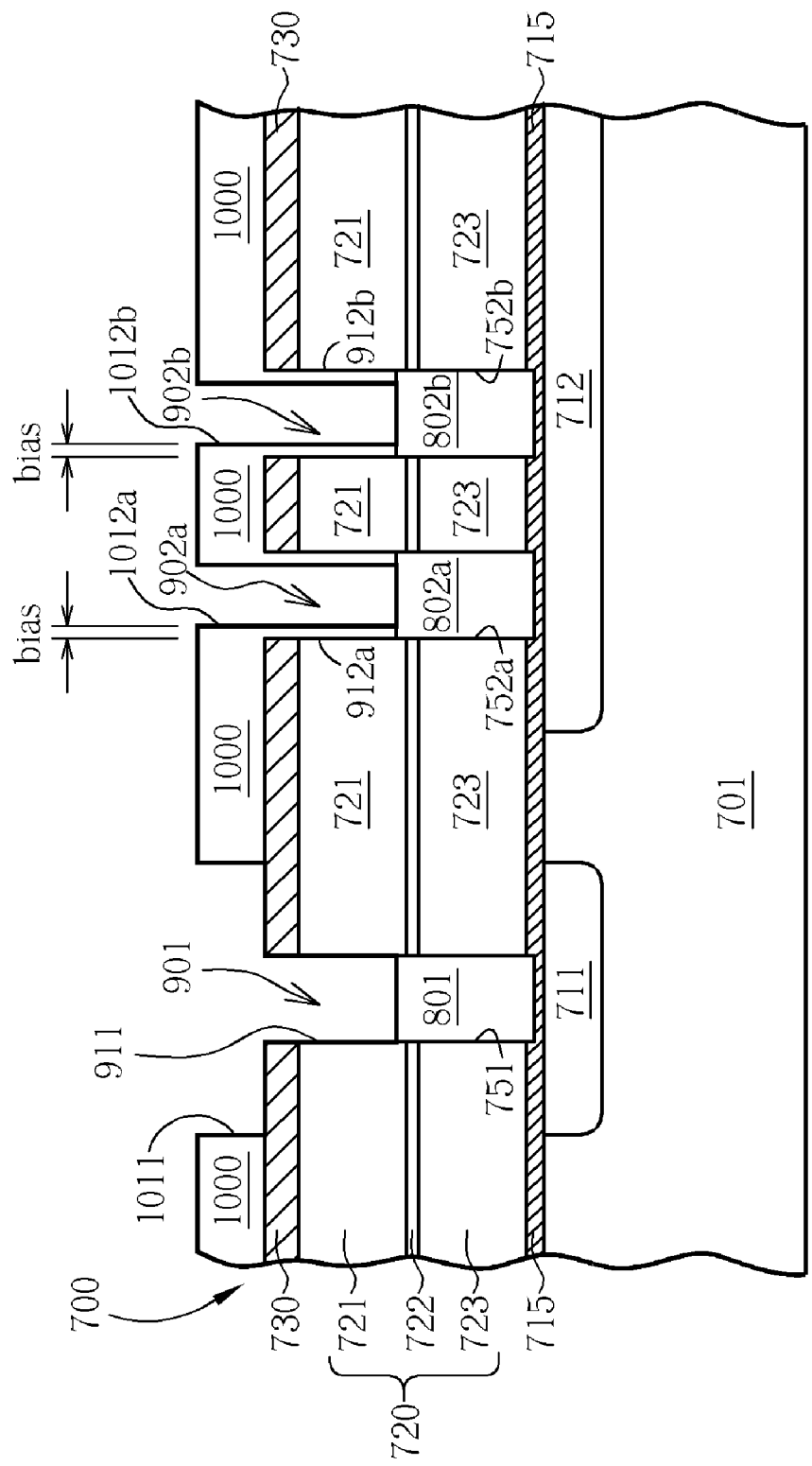

As shown in FIG. 11, following the coating of the second photoresist layer 1000, a photolithographic process is carried out. In the photolithographic process (or trench photolithographic process), a photo mask having a predetermined trench pattern thereon (shown in FIG. 14) is provided, which is positioned over the semiconductor substrate 700 in an exposure tool. Light such as deep UV is projected on the photo-mask and passes through clear areas of the photo-mask to irradiate the underlying second photoresist layer 1000, thereby forming latent trench images, which is soluble in a developer, over the respective recesses 901, 902a and 902b in the second photoresist layer 1000. Thereafter, the exposed second photoresist layer 1000 is developed using a proper developer. The latent trench images are removed to form trench patterns 1011, 1012a and 1012b directly above the recesses 901, 902a and 902b, respectively.

It is the main feature of the present invention that after development the sidewalls 912a and 912b of the neighboring recesses 902a and 902b are partially masked and protected by the second photoresist layer 1000, and are thus not exposed to etchant used in the subsequent trench etch step.

Figure 13:
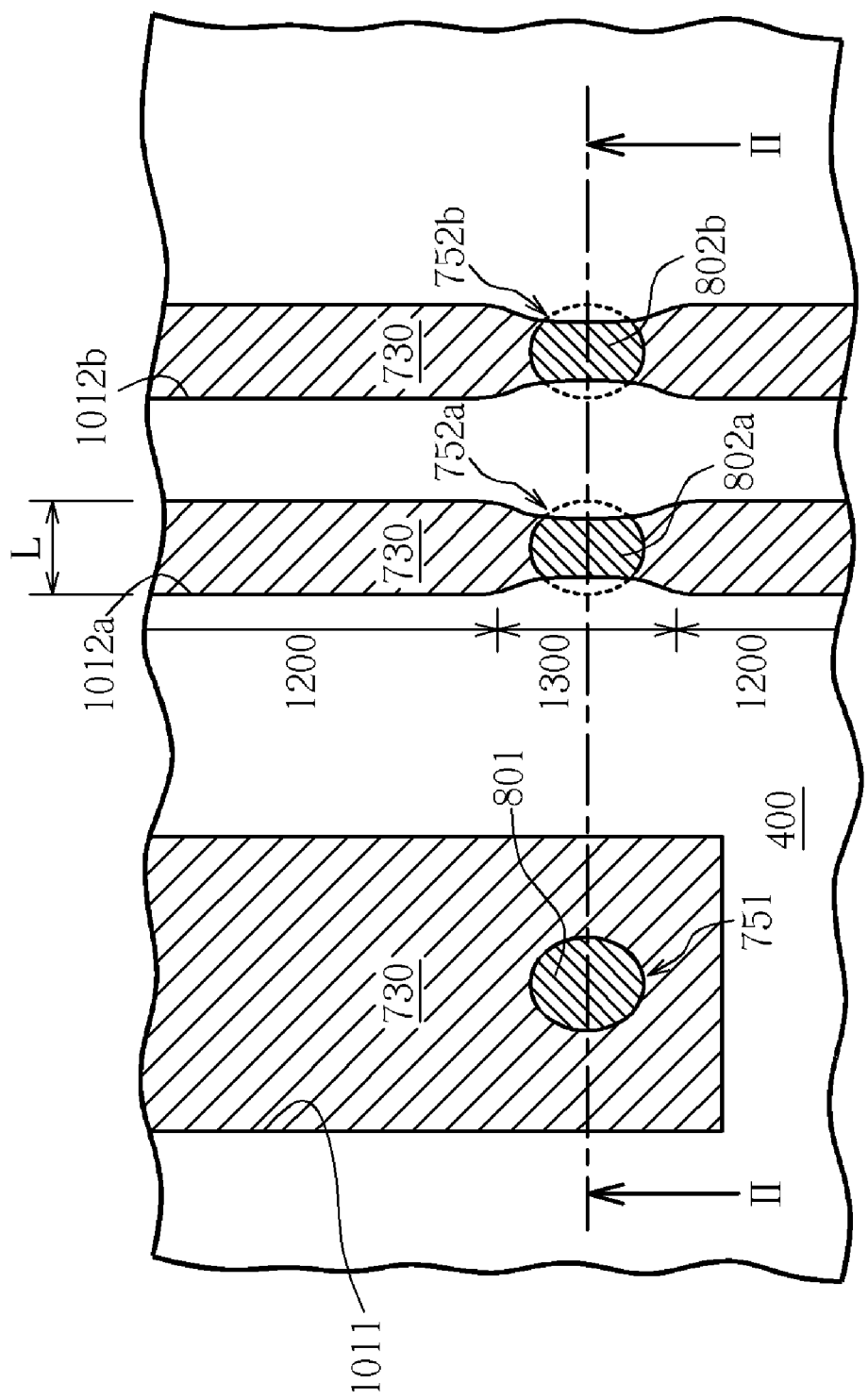
FIG. 13 is a plan view of the via holes previously formed in the dielectric stack and trench patterns of the second photoresist layer of FIG. 11.

Please now refer to FIG. 13 and briefly back to FIG. 11, wherein FIG. 13 is a plan view of the via holes previously formed in the dielectric stack 720 and trench patterns of the second photoresist layer 1000 of FIG. 11, and FIG. 11 is a cross-sectional view taken along line II—II of FIG. 13. As shown in FIGS. 11 and 13, the line width of the trench pattern 1011 is larger than the diameter of the underlying via hole 751. According to the preferred embodiment, each of the trench patterns 1012a and 1012b includes a first section 1200 that does not overlap with the underlying via hole and has a substantially constant line width of L, and a tapered second section 1300 that is situated directly above the via hole thereof and has a tapered line width that is less than L.

Figure 14:
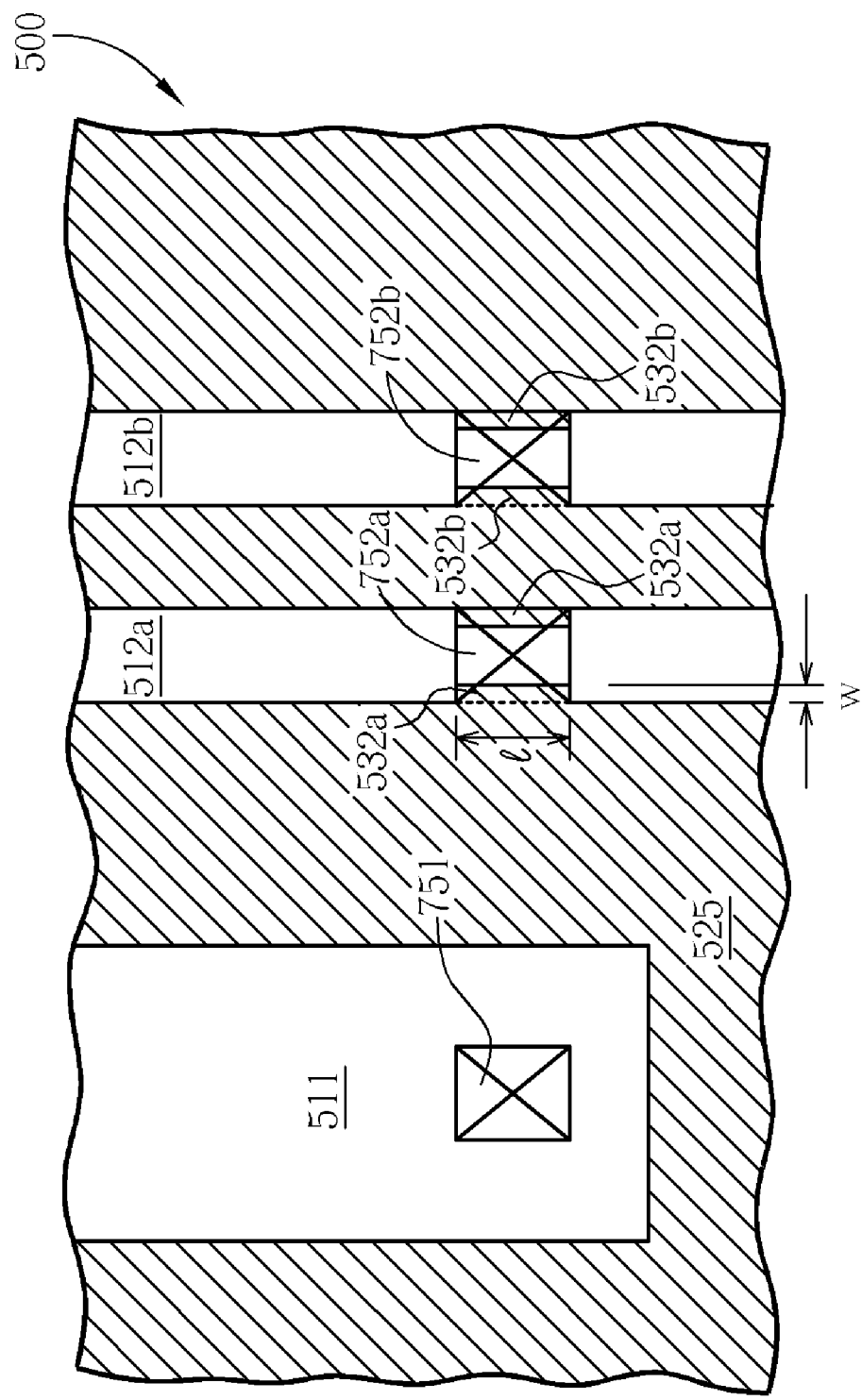
FIG. 14 depicts the layout of a photo mask for printing a pattern of photoresist corresponding to the interconnection area depicted in FIG. 13.

The layout of the photo mask for printing a pattern of photoresist corresponding to the interconnection area depicted in FIG. 13 is illustrated in FIG. 14. The photo mask 500 includes a dark region 525, and bright line region 511 for printing trench 1011 in the second photoresist layer 1000, a bright line region 512a for printing trench 1012a, and a bright line region 512b for printing trench 1012b. The line width of the bright line region 512a is equal to the diameter of the underlying via hole 752a and line width of the bright line region 512b is equal to the diameter of the underlying via hole 752b. The via hole 752a and via hole 752b are close to each other (i.e., small pitched, dense via holes). The bright line region 512a is biased with a pair of dark regions 532a at the area that is directly above the via hole 752a. The bright line region 512b is biased with a pair of dark regions 532b at the area that is directly above the via hole 752b.

According to the preferred embodiment, the biasing dark regions 532a and 532b are equal in size, and each of which is defined by a width w and length l. Preferably, the length l of the biasing dark regions 532a and 532b is equal to or greater than the diameter of the via hole, and the width w is about 5%–30% of the length l. For example, for a via hole with a diameter of about 0.2 micrometers, the dimension of each biasing dark region will be 200 nanometers (minimum length)×10–60 nanometers (width).

Figure 12:
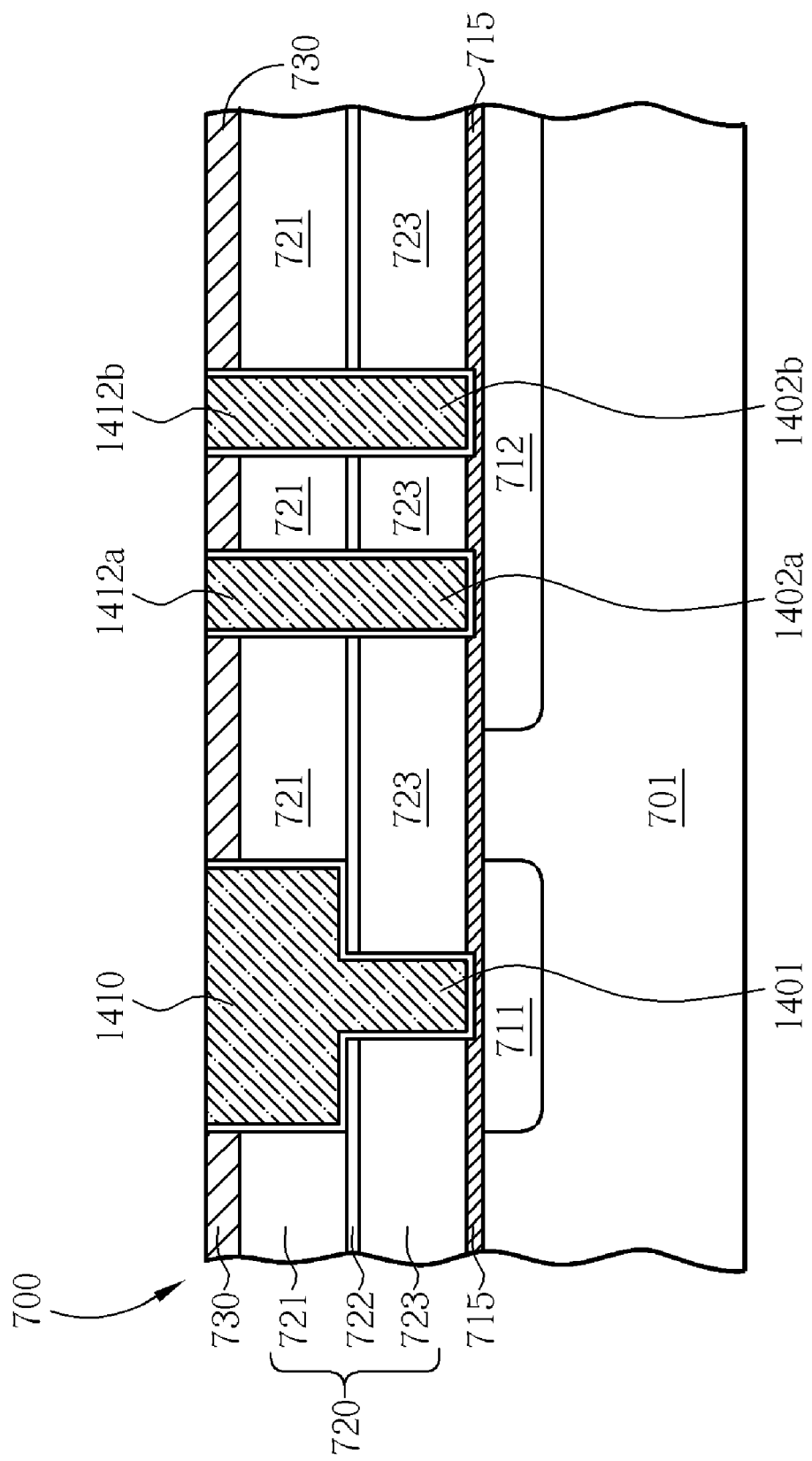

As shown in FIGS. 12–13, using the patterned second photoresist layer 1000 as an etching hard mask, a dry etching process is carried out to etch trenches into the first dielectric layer 721 through the trench patterns 1011, 1012a and 1012b directly above the recesses 901, 902a and 902b, respectively. After the resist is stripped and the etch-stop layer at the bottom of the via is removed by dry-etching, the metal that fills both the vias and the trenches can be deposited. After deposition, it is polished back to create the dual-damascene structures 1410, 1412a and 1412b. The dual-damascene structure 1410 comprises via plug 1401. The dual-damascene structure 1412a comprises via plug 1402a. The dual-damascene structure 1412b comprises via plug 1402b.

Figure 15:
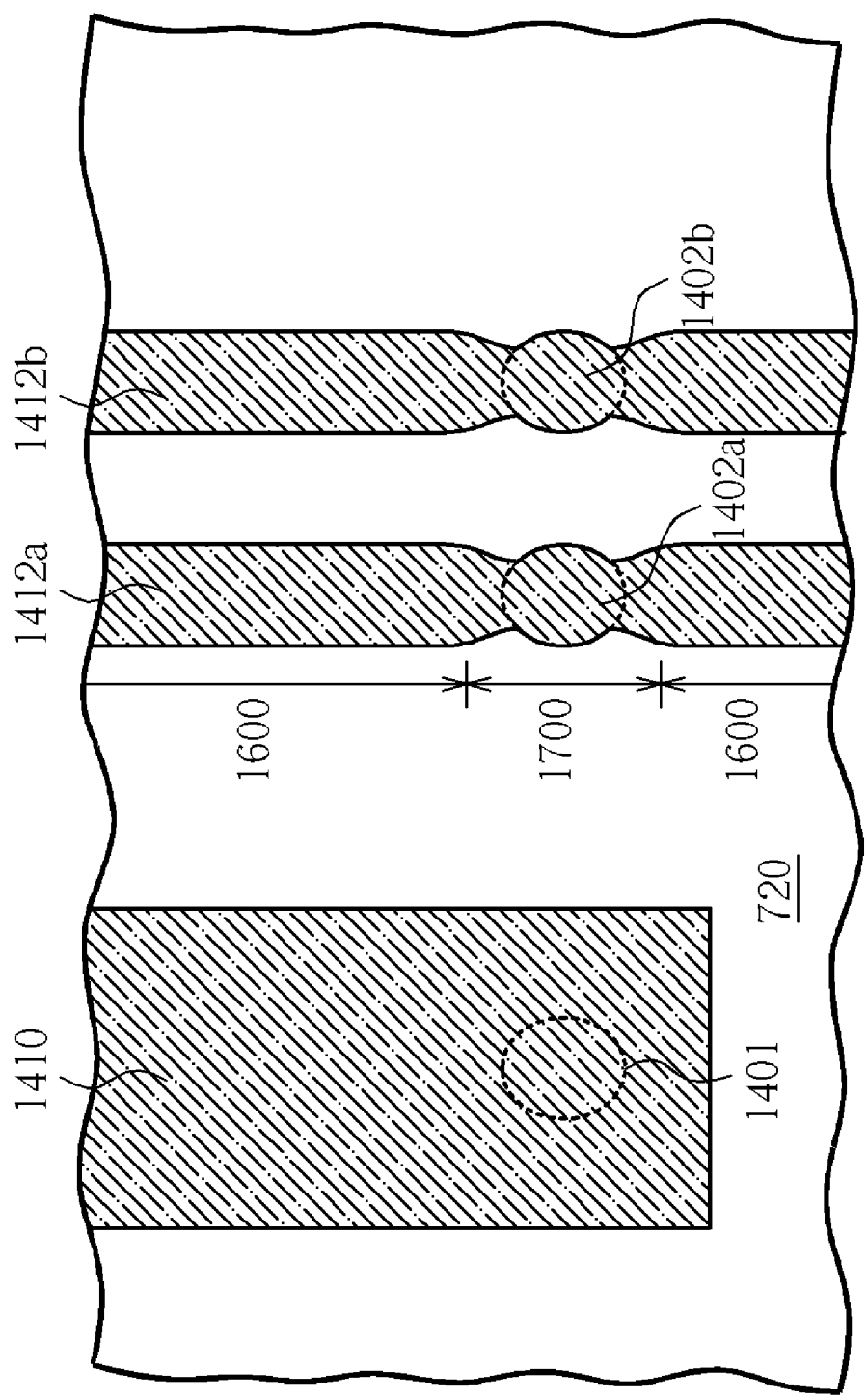
FIG. 15 is a plan view of the dual-damascene structures of FIG. 12.

FIG. 15 is a plan view of the dual-damascene structures 1410, 1412a and 1412b of FIG. 12. As shown in FIG. 15, each of the dual-damascene structures 1412a and 1412b includes a first section 1600 that does not overlap with the underlying via plug and has a substantially constant line width of L, and a notched second section 1700 that is situated directly above the via hole thereof.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A via-first dual damascene process, comprising:
   providing a semiconductor substrate having a dielectric layer deposited over the semiconductor substrate, wherein the dielectric layer has a via opening;
   filling the via openings with a gap-filling polymer to form a gap-filling polymer (GFP) layer on the dielectric layer;
   etching the GFP layer back to a predetermined depth to form a GFP plug in the via opening, wherein an exposed surface of the GFP plug is lower than a top surface of the dielectric layer, thereby forming a recess above the via opening;
   coating a photoresist layer over the dielectric layer, the photoresist layer filling the recess;
   performing a lithographic process to form a trench line pattern in the photoresist layer above the via opening, wherein the trench line pattern has a first section that has a substantially constant line width L and does not overlap with the via opening, and a second section that is directly above the via opening and has a tapered line width smaller than L, wherein the line width L is substantially equal to diameter of the via opening; and
   etching the dielectric layer and the GFP layer through the trench line pattern using the photoresist layer as an etching mask.

2. The via-first dual damascene process of claim 1 wherein the dielectric layer is a dielectric stack comprising a lower dielectric, an upper dielectric and an etch stop layer interposed between the lower dielectric and the upper dielectric.

3. The via-first dual damascene process of claim 1 wherein the gap-filling polymer comprises i-line resists.

4. The via-first dual damascene process of claim 1 wherein when etching the dielectric layer and the GFP layer through the trench line pattern using the photoresist layer as an etching mask, sidewall of the recess above the via opening is partially masked by the photoresist layer.

5. The via-first dual damascene process of claim 1 wherein the dielectric layer has a dielectric constant of less than 3.0.

6. The via-first dual damascene process of claim 1 wherein a cap layer is provided on the dielectric layer.

7. The via-first dual damascene process of claim 6 wherein the cap layer comprises silicon oxy-nitride.

8. A via-first dual damascene process, comprising:
   providing a semiconductor substrate having a dielectric layer deposited over the semiconductor substrate, wherein the dielectric layer has a first via opening and a second via opening disposed in close proximity to the first via opening;
   filling the first and second via openings with a gap-filling polymer to form a gap-filling polymer (GFP) layer on the dielectric layer;
   etching the GFP layer back to a predetermined depth to form a first GFP plug in the first via opening and a second GFP plug in the second via opening, wherein exposed surfaces of the first and second GFP plugs are lower than a top surface of the dielectric layer, thereby forming a first recess above the first via opening and a second recess above the second via opening;
   coating a photoresist layer over the dielectric layer, the photoresist layer filling the first and second recesses;
   performing a lithographic process to form a first trench line pattern in the photoresist layer above the first via opening and a second trench line pattern in the photoresist layer above the second via opening, wherein the first trench line patterns has a first section that has a substantially constant line width L and does not overlap with the first via opening thereof, and a second section that is directly above the first via opening thereof and has a tapered line width smaller than L; and
   etching the dielectric layer and the GFP layer through the first and second trench line patterns using the photoresist layer as an etching mask.

9. The via-first dual damascene process of claim 8 wherein the dielectric layer is a dielectric stack comprising a lower dielectric, an upper dielectric and an etch stop layer interposed between the lower dielectric and the upper dielectric.

10. The via-first dual damascene process of claim 8 wherein the dielectric layer has a dielectric constant of less than 3.0.

11. The via-first dual damascene process of claim 8 wherein a cap layer is provided on the dielectric layer.

12. The via-first dual damascene process of claim 11 wherein the cap layer comprises silicon oxy-nitride.

13. The via-first dual damascene process of claim 8 wherein the gap-filling polymer comprises i-line resists.

14. The via-first dual damascene process of claim 8 wherein the line width L is substantially equal to diameter of the first via opening.

* * * * *